(12) United States Patent
Xiao

(10) Patent No.: US 12,308,672 B2
(45) Date of Patent: May 20, 2025

(54) ELECTRONIC DEVICE FAST CHARGING METHOD, APPARATUS, AND DEVICE

(71) Applicant: Honor Device Co., Ltd., Shenzhen (CN)

(72) Inventor: Fuzhou Xiao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 89 days.

(21) Appl. No.: 18/194,367

(22) Filed: May 26, 2023

(65) Prior Publication Data

US 2023/0283085 A1    Sep. 7, 2023

Related U.S. Application Data

(63) Continuation of application No. 16/415,483, filed on May 17, 2019, now Pat. No. 11,621,568, which is a continuation of application No. 15/326,526, filed as application No. PCT/CN2014/082339 on Jul. 16, 2014, now Pat. No. 10,333,326.

(51) Int. Cl.
*H02J 7/00* (2006.01)
*G01R 19/30* (2006.01)

(52) U.S. Cl.
CPC .............. *H02J 7/00* (2013.01); *G01R 19/30* (2013.01); *Y02B 40/00* (2013.01)

(58) Field of Classification Search
CPC ....................................................... H02J 7/00
USPC ...................................................... 320/107
See application file for complete search history.

(56) References Cited

U.S. PATENT DOCUMENTS

| | | | |
|---|---|---|---|
| 9,197,075 B2 | 11/2015 | Jeansonne et al. | |
| 2004/0000892 A1 | 1/2004 | Jae-Seung | |
| 2007/0278991 A1 | 12/2007 | Miyata | |
| 2008/0084189 A1* | 4/2008 | Kim ............... | G06F 1/263 |
| | | | 320/160 |
| 2008/0222431 A1 | 9/2008 | Paniagua et al. | |

(Continued)

FOREIGN PATENT DOCUMENTS

| | | |
|---|---|---|
| CN | 101299542 A | 11/2008 |
| CN | 101499670 A | 8/2009 |

(Continued)

*Primary Examiner* — Jerry D Robbins
(74) *Attorney, Agent, or Firm* — Conley Rose, P.C.

(57) ABSTRACT

A fast charging method for an electronic device is disclosed. The method includes obtaining, when the electronic device has a successful communication handshake with a USB host device using the USB interface, a corresponding charging data set of the electronic device under the charging current threshold by means of measurement according to a preset charging current threshold. The charging current threshold includes at least a first charging current threshold and a second charging current threshold. The charging data set includes at least a corresponding first charging voltage value and a corresponding first charging current value of the electronic device under the first charging current threshold, and a corresponding second charging voltage value and a corresponding second charging current value of the electronic device under the second charging current threshold. The method further includes determining, according to the charging data set, a maximum charging current value.

19 Claims, 4 Drawing Sheets

(56) References Cited

U.S. PATENT DOCUMENTS

| | | | |
|---|---|---|---|
| 2009/0009187 A1* | 1/2009 | Kwak | G06F 13/4081 |
| | | | 324/630 |
| 2009/0189569 A1* | 7/2009 | Hsu | H02J 7/00714 |
| | | | 320/160 |
| 2010/0164440 A1 | 7/2010 | Ikeda | |
| 2012/0098495 A1 | 4/2012 | Yang et al. | |
| 2012/0280563 A1 | 11/2012 | Smith et al. | |
| 2012/0326656 A1* | 12/2012 | Ikeda | H02J 7/342 |
| | | | 320/162 |
| 2013/0154551 A1 | 6/2013 | Jeansonne et al. | |
| 2013/0249500 A1 | 9/2013 | He | |
| 2014/0047248 A1 | 2/2014 | Heo et al. | |
| 2017/0093189 A1* | 3/2017 | Zeng | H02J 7/02 |
| 2018/0026469 A1* | 1/2018 | Kamath | H02J 7/04 |
| | | | 320/106 |

FOREIGN PATENT DOCUMENTS

| | | |
|---|---|---|
| CN | 101820177 A | 9/2010 |
| CN | 101986509 A | 3/2011 |
| CN | 102457094 A | 5/2012 |
| CN | 102938572 A | 2/2013 |
| CN | 103080868 A | 5/2013 |
| CN | 103326078 A | 9/2013 |
| CN | 103475068 A | 12/2013 |
| EP | 1553480 A1 | 7/2005 |
| EP | 1705549 A1 | 9/2006 |
| EP | 2202864 A2 | 6/2010 |
| EP | 2264855 A2 | 12/2010 |
| EP | 2854253 A1 | 4/2015 |
| JP | 2010154692 A | 7/2010 |
| JP | 2011509466 A | 3/2011 |
| JP | 2011076310 A | 4/2011 |
| JP | 2013078163 A | 4/2013 |
| JP | 2013536965 A | 9/2013 |
| JP | 5519853 B1 | 6/2014 |
| JP | 2015095936 A | 5/2015 |
| KR | 20050002217 A | 1/2005 |
| KR | 20070113100 A | 11/2007 |
| KR | 20080011955 A | 2/2008 |
| KR | 20120124372 A | 11/2012 |
| KR | 20140020514 A | 2/2014 |

* cited by examiner

… (1) …

ELECTRONIC DEVICE FAST CHARGING METHOD, APPARATUS, AND DEVICE

CROSS-REFERENCE TO RELATED APPLICATIONS

This application is a continuation of U.S. patent application Ser. No. 16/415,483, filed on May 17, 2019, which is a continuation of U.S. patent application Ser. No. 15/326,526 filed on Jan. 16, 2017, now U.S. Pat. No. 10,333,326. The U.S. patent application Ser. No. 15/326,526 is a national stage of International Application No. PCT/CN2014/082339, filed on Jul. 16, 2014. All of the aforementioned applications are hereby incorporated by reference in their entireties.

TECHNICAL FIELD

Embodiments of the present disclosure relate to the communications field, and in particular, to an electronic device fast charging method, apparatus, and device.

BACKGROUND

Currently, there are generally two manners for charging an electronic device: one manner is charging the electronic device by connecting the electronic device to a dedicated charger (for example, a mobile phone charger) of the electronic device; the other manner is charging the electronic device by connecting the electronic device to a Universal Serial Bus (USB) host device (for example, a personal computer (PC)) using a USB interface. Because host devices having a USB interface are widely used, the charging manner of using a USB host device is widely applied because this charging manner is convenient.

In other approaches, when the electronic device is inserted into the USB host device using the USB interface, the electronic device determines a USB supply current according to whether a communication handshake with the USB host device is successful. If the communication handshake with the USB host device fails, the USB charging current is limited below 100 milliamperes ((mA), a current measurement unit, where 1000 mA=1 A (1 ampere)). If the communication handshake with the USB host device is successful, the USB charging current is limited below 500 mA.

However, because a charging current when charging is performed using the USB interface is generally limited within 500 mA, a charging speed is relatively low. Especially, if the battery of an electronic device is depleted or the battery is extremely low, charging using the USB cannot support a user to perform a power-consuming operation such as making a call or playing a game. To simply improve a charging current causes a device to be restarted repeatedly due to an insufficient charging voltage because the charging current becomes excessively high. In addition, the excessively high charging current further causes a device board to heat. Continuous heat of the device board further causes lines on the board to expand with heat and be broken and damages the board, and may even cause a fire safety accident. Therefore, how to implement fast charging of an electronic device while ensuring that the device is safe is an urgent problem that needs to be resolved.

SUMMARY

In view of this, embodiments of the present disclosure provide an electronic device fast charging method, apparatus, and device, in order to implement safe and fast charging of an electronic device.

Accordingly, the following technical solutions are used in the embodiments of the present disclosure: According to a first aspect of the embodiments of the present disclosure, a fast charging method for an electronic device is disclosed, where the electronic device has a USB interface, and the method includes: when the electronic device has a successful communication handshake with a USB host device using the USB interface, obtaining, by means of measurement according to a preset charging current threshold, a corresponding charging data set of the electronic device under the charging current threshold, where the charging current threshold includes at least a first charging current threshold and a second charging current threshold, and the charging data set includes at least a corresponding first charging voltage value and a corresponding first charging current value of the electronic device under the first charging current threshold, and a corresponding second charging voltage value and a corresponding second charging current value of the electronic device under the second charging current threshold; determining, according to the charging data set, a maximum charging current value corresponding to the electronic device; and setting the determined maximum charging current value as a third charging current threshold of the electronic device, and controlling charging of the electronic device according to the third charging current threshold.

In a first possible implementation manner of the first aspect, the obtaining, by means of measurement according to a preset charging current threshold, a corresponding charging data set of the electronic device under the charging current threshold includes: setting a data collection point in a power management integrated circuit of the electronic device, and acquiring the corresponding charging data set of the electronic device under the charging current threshold from an analog to digital converter of the power management integrated circuit.

With reference to the first possible implementation manner of the first aspect, in a second possible implementation manner of the first aspect, the determining, according to the charging data set, a maximum charging current value corresponding to the electronic device includes: obtaining a supply voltage value of the USB host device and an impedance value of a USB connection cable by means of calculation according to the first charging voltage value, the first charging current value, the second charging voltage value, and the second charging current value; obtaining a charging current consumption rate coefficient by means of calculation according to the supply voltage value of the USB host device and the impedance value of the USB connection cable that are obtained by means of calculation, the first charging current threshold, and the second charging current threshold; and determining, according to the charging current consumption rate coefficient obtained by means of calculation, a maximum charging current value that corresponds to the electronic device when a minimum working voltage of the electronic device is met.

In a third possible implementation manner of the first aspect, the method further includes: when the determined maximum charging current value is set as the third charging current threshold of the electronic device, switching the charging current threshold of the electronic device from the third charging current value to the first charging current threshold after charging of the electronic device is controlled according to the third charging current threshold for a first time value, and controlling charging of the electronic device according to the first charging current threshold.

With reference to the third possible implementation manner of the first aspect, in a fourth possible implementation manner of the first aspect, the method further includes: after charging of the electronic device is controlled according to the first charging current threshold for a second time value, switching the charging current threshold of the electronic device from the first charging current value to the third charging current threshold, and controlling charging of the electronic device according to the third charging current threshold.

With reference to the third possible implementation manner of the first aspect, in a fifth possible implementation manner of the first aspect, the switching the charging current threshold of the electronic device from the third charging current value to the first charging current threshold after charging of the electronic device is controlled according to the third charging current threshold for a first time value, and controlling charging of the electronic device according to the first charging current threshold includes: detecting temperature data of the electronic device; determining whether the temperature data is greater than a first temperature threshold; and when the temperature data is greater than the first temperature threshold, switching the charging current threshold of the electronic device from the third charging current value to the first charging current threshold, and controlling charging of the electronic device according to the first charging current threshold.

With reference to the third possible implementation manner of the first aspect, in a sixth possible implementation manner of the first aspect, the switching the charging current threshold of the electronic device from the third charging current value to the first charging current threshold after charging of the electronic device is controlled according to the third charging current threshold for a first time value, and controlling charging of the electronic device according to the first charging current threshold includes: determining whether duration in which charging of the electronic device is controlled according to the third charging current threshold is greater than a preset first time threshold; and when the duration in which charging of the electronic device is controlled according to the third charging current threshold is greater than the preset first time threshold, switching the charging current threshold of the electronic device from the third charging current value to the first charging current threshold, and controlling charging of the electronic device according to the first charging current threshold.

In a seventh possible implementation manner of the first aspect, the third charging current threshold is greater than the first charging current threshold, and the first charging current threshold is greater than the second charging current threshold.

According to a second aspect of the embodiments of the present disclosure, a fast charging apparatus is disclosed, applied to an electronic device, where the electronic device has a USB interface, and the apparatus includes: a measurement unit, configured to: when the electronic device has a successful communication handshake with a USB host device using the USB interface, obtain, by means of measurement according to a preset charging current threshold, a corresponding charging data set of the electronic device under the charging current threshold, where the charging current threshold includes at least a first charging current threshold and a second charging current threshold, and the charging data set includes at least a corresponding first charging voltage value and a corresponding first charging current value of the electronic device under the first charging current threshold, and a corresponding second charging voltage value and a corresponding second charging current value of the electronic device under the second charging current threshold; a charging current value determining unit, configured to determine, according to the charging data set, a maximum charging current value corresponding to the electronic device; and a charging unit, configured to set the determined maximum charging current value as a third charging current threshold of the electronic device, and control charging of the electronic device according to the third charging current threshold.

In a first possible implementation manner of the second aspect, the measurement unit is further configured to: set a data collection point in a power management integrated circuit of the electronic device, and acquire the corresponding charging data set of the electronic device under the charging current threshold from an analog to digital converter of the power management integrated circuit.

With reference to the first possible implementation manner of the second aspect, in a second possible implementation manner of the second aspect, the charging current value determining unit includes: a first calculation unit, configured to obtain a supply voltage value of the USB host device and an impedance value of a USB connection cable by means of calculation according to the first charging voltage value, the first charging current value, the second charging voltage value, and the second charging current value that are obtained by means of measurement by the measurement unit; second calculation unit, configured to obtain a charging current consumption rate coefficient by means of calculation according to the supply voltage value of the USB host device and the impedance value of the USB connection cable that are obtained by the first calculation unit by means of calculation, the first charging current threshold, and the second charging current threshold; and a third calculation unit, configured to determine, according to the charging current consumption rate coefficient obtained by the second calculation unit by means of calculation, a maximum charging current value that corresponds to the electronic device when a minimum working voltage of the electronic device is met.

In a third possible implementation manner of the second aspect, the apparatus further includes: a first switch unit, configured to: when the determined maximum charging current value is set as the third charging current threshold of the electronic device, switch the charging current threshold of the electronic device from the third charging current value to the first charging current threshold after charging of the electronic device is controlled according to the third charging current threshold for a first time value, and control charging of the electronic device according to the first charging current threshold; and a second switch unit, configured to: after charging of the electronic device is controlled according to the first charging current threshold for a second time value, switch the charging current threshold of the electronic device from the first charging current value to the third charging current threshold, and control charging of the electronic device according to the third charging current threshold.

With reference to the third possible implementation manner of the second aspect, in a fourth possible implementation manner of the second aspect, the first switch unit includes: a temperature detection unit, configured to detect temperature data of the electronic device; a first judging unit, configured to receive the temperature data detected by the temperature detection unit and determine whether the temperature data is greater than a first temperature threshold; and a first switch execution unit, configured to receive a determining result of the first judging unit and when the determining result shows that the temperature data is greater than the first temperature threshold, switch the charging current threshold of the electronic device from the third charging current value to the first charging current threshold, and control charging of the electronic device according to the first charging current threshold; or the first switch unit includes: a second judging unit, configured to determine whether duration in which charging of the electronic device is controlled according to the third charging current threshold is greater than a preset first time threshold; and a second switch execution unit, configured to receive a determining result of the second judging unit and when the determining result shows that the duration in which charging of the electronic device is controlled according to the third charging current threshold is greater than the preset first time threshold, switch the charging current threshold of the electronic device from the third charging current value to the first charging current threshold, and control charging of the electronic device according to the first charging current threshold.

Technical effects of the foregoing technical solutions are analyzed as follows. In the embodiments of the present disclosure, when an electronic device has a successful communication handshake with a USB host device using a USB interface, by presetting a first charging current threshold and a second charging current threshold for the electronic device, a first charging voltage value and a first charging current value of the electronic device under the first charging current threshold, and a second charging voltage value and a second charging current value of the electronic device under the second charging current threshold are separately obtained by means of measurement; a maximum charging current value corresponding to the electronic device is determined according to charging data obtained by means of measurement; the determined maximum charging current value is set as a third charging current threshold of the electronic device; and charging of the electronic device is controlled according to the third charging current threshold. Because the maximum charging current value obtained by means of measurement in the present disclosure is accurate and reliable, and is generally greater than 500 mA, while ensuring that the device is safe, a charging speed of the electronic device is greatly improved, the charging efficiency of the device is improved, and fast charging of the device is implemented.

DESCRIPTION OF EMBODIMENTS

To resolve a technical problem in other approaches that a charging speed of an electronic device is low, embodiments of the present disclosure provide an electronic device fast charging method, apparatus, and device, in order to implement safe and fast charging of an electronic device.

To make a person skilled in the art understand the technical solutions in the present disclosure better, the following clearly and completely describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

The terms used in the embodiments of the present disclosure are merely for the purpose of illustrating specific embodiments, and are not intended to limit the present disclosure. The terms "a", "said" and "the" of singular forms used in the embodiments and the appended claims of the present disclosure are also intended to include plural forms, unless otherwise specified in the context clearly. It should also be understood that, the term "and/or" used herein indicates and includes any or all possible combinations of one or more associated listed items.

It should be understood that, although in the embodiments of the present disclosure, terms such as "first", "second", and "third" may be used to describe various charging current thresholds, charging data, charging voltage values, and charging current values, these charging current thresholds, charging data, charging voltage values, and charging current values are not limited to the terms. The terms are merely used to distinguish the charging current thresholds, the charging data, the charging voltage values, and the charging current values. For example, without departing from the scope of the embodiments of the present disclosure, a first charging current threshold may also be referred to as a second charging current threshold. Similarly, the second charging current threshold may also be referred to as the first charging current threshold.

Depending on the context, for example, the word "if" used herein may be interpreted as "while" or "when" or "in response to determining" or "in response to detection". Similarly, depending on the context, the phrase "if determining" or "if detecting (a stated condition or event)" may be interpreted as "when determining" or "in response to determining" or "when detecting (the stated condition or event)" or "in response to detecting (the stated condition or event)".

One Embodiment

Figure 1:
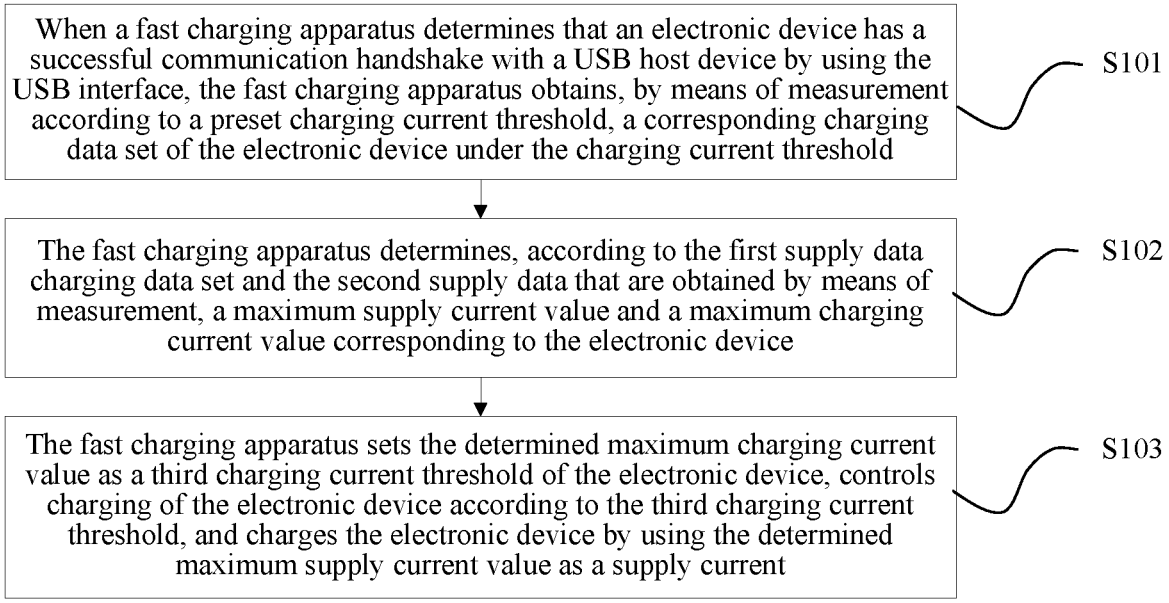
FIG. 1 is a schematic diagram of an embodiment of a fast charging method for an electronic device according to the present disclosure.

Refer to FIG. 1, which is a schematic diagram of an embodiment of a fast charging method for an electronic device according to the present disclosure. The method shown in FIG. 1 is applied to an electronic device, and the electronic device has a USB interface and can implement a communication connection to a USB host device using the USB interface.

S101: When a fast charging apparatus determines that the electronic device has a successful communication handshake with a USB host device using the USB interface, the fast charging apparatus obtains, by means of measurement according to a preset charging current threshold, a corresponding charging data set of the electronic device under the charging current threshold. A first charging current threshold, a first charging current threshold, and first charging data.

In this embodiment of the present disclosure, the electronic device may have two charging modes: a fast charging mode and a normal charging mode. When the electronic device is switched to the fast charging mode, the fast charging apparatus obtains, by means of measurement according to a preset charging current threshold, charging data of the electronic device under the charging current threshold; determines, according to the charging data, a maximum charging current value corresponding to the electronic device; sets the determined maximum charging current value as a third charging current threshold of the electronic device; and controls charging of the electronic device according to the third charging current threshold. Because the third charging current threshold is generally greater than a charging current threshold (500 mA) that is set in a USB communications protocol, fast charging of the electronic device can be implemented. When the electronic device is switched to the normal charging mode, a method in other approaches may be used for charging, that is, the charging current threshold of the electronic device is set to 500 mA regulated in the USB communications protocol, and charging of the electronic device is controlled according to the charging current threshold. In this case, an actual charging current of the electronic device is generally less than 500 mA. Certainly, a person skilled in the art may understand that the electronic device may have only one charging mode, that is, the fast charging mode.

The electronic device may provide a graphical user interface, and a user sets the charging mode of the electronic device using the graphical user interface. The electronic device receives a setting command of the user, and the electronic device is switched from the normal charging mode to the fast charging mode. Alternatively, the electronic device may receive a setting command of the user, and a default charging mode of the electronic device is set to the fast charging mode. Certainly, the charging mode of the electronic device may be set by a system of the electronic device, which is not limited herein.

When the electronic device is inserted into the USB host device by means of the USB interface, the fast charging apparatus detects whether the electronic device has a successful communication handshake with the USB host device. In specific implementation, when the user inserts the electronic device into the host device using the USB interface, if the electronic device detects that a level of a data line of a port of the electronic device is pulled up, it is determined that the electronic device is inserted into the host device. In this case, the electronic device triggers interruption. An interruption service program instructs a USB drive to send, using an end point (end point), a USB enumeration command to the USB host device. The USB host device sends a response to the electronic device and determines, by exchanging a series of commands, whether USB communication can be established. If the USB communication can be established, it is considered that the electronic device has a successful communication handshake with the USB host device.

When the electronic device has a successful communication handshake with the USB host device using the USB interface, the fast charging apparatus obtains, by means of measurement according to the preset charging current threshold, the corresponding charging data set of the electronic device under the charging current threshold. The charging current threshold includes at least a first charging current threshold and a second charging current threshold, and the charging data set includes at least a corresponding first charging voltage value and a corresponding first charging current value of the electronic device under the first charging current threshold, and a corresponding second charging voltage value and a corresponding second charging current value of the electronic device under the second charging current threshold. In a specific implementation, the first charging current threshold is a preconfigured threshold and may be, for example, the charging current threshold 500 mA that is regulated in the USB Protocol. The first charging current threshold is a maximum charging current provided by the USB host device for the electronic device in this case, that is, when the first charging current threshold of the electronic device is set, a charging current provided by the USB host device should not be greater than the first charging current threshold, for example, not greater than 500 mA. Correspondingly, the maximum charging current value of the electronic device is not greater than the first charging current threshold. After the first charging current threshold is set successfully, first charging data of the electronic device under the first charging current threshold is collected. The first charging data may include the first charging voltage value and the first charging current value. The first charging voltage value refers to a voltage value provided by the USB host device for the electronic device under the first charging current threshold, and the first charging current value refers to a current value provided by the USB host device for the electronic device under the first charging current threshold. In specific implementation, the fast charging apparatus sets a register of a power management integrated circuit (PMIC) of the electronic device, and stores, in the register, the charging current threshold that is set for the electronic device, for example, the first charging current threshold. After the PMIC detects that there is a device coupled to a charging system, that is, after the PMIC determines that the electronic device is connected to the USB host device using the USB interface, a charging current and a charging voltage of the electronic device are adjusted according to the first charging current threshold stored in the register. In an embodiment, the PMIC includes a pulse signal generator, a voltage regulator circuit, a pulse width adjustment circuit, a voltage and current detection circuit, and a feedback circuit. The PMIC controls the intensity of the charging current using the voltage and current detection circuit and the feedback circuit, such that the charging current is not greater than the charging current threshold set in the register.

The obtaining, by means of measurement according to a preset charging current threshold, a corresponding charging data set of the electronic device under the charging current threshold includes: setting a data collection point in a power management integrated circuit of the electronic device, and acquiring, by the power management integrated circuit, the corresponding charging data set of the electronic device under the charging current threshold from an analog to digital converter of the power management integrated circuit. In specific implementation, the PMIC of the electronic device has a corresponding analog to digital converter (ADC) configured to monitor values such as the charging current and the charging voltage. Therefore, the first charging voltage value and the first charging current value can be obtained by reading corresponding values in the ADC. The data collection point may be set on the PMIC, corresponding to a power input point of the electronic device. In specific implementation, to obtain collected data that is more accurate, collection may be performed multiple times (for example, five times), and an average value of collected data is used as final measurement data to calculate the maximum charging current value.

After the first charging voltage value and the first charging current value are obtained according to the preset second charging current threshold, second measurement is performed on the charging data of the electronic device to collect the corresponding second charging voltage value and the corresponding second charging current value of the electronic device under the second charging current threshold. The second charging current threshold is a preconfigured threshold and may be determined according to an empirical value. Generally, the second charging current threshold is less than the first charging current threshold. Theoretically, the maximum charging current value obtained by means of calculation is more accurate if the second charging current threshold is set to be far less than the first charging current threshold. However, if a value of the second charging current threshold is set to be excessively small, there is a problem that errors in measuring charging voltage and charging current values are relatively large, causing a relatively large calculation error, and therefore the maximum charging current value obtained by means of calculation is inaccurate. Therefore, a proper second charging current threshold may be determined according to experience and a theory. In an embodiment of the present disclosure, the second charging current threshold may be set to 450 mA and certainly, may be set to 400 mA or 350 mA, which is not limited herein. The second charging current threshold is a maximum charging current provided by the USB host device for the electronic device in this setting case, that is, when the second charging current threshold of the electronic device is set, a charging current provided by the USB host device should not be greater than the second charging current threshold, for example, not greater than 450 mA. Correspondingly, when the charging current threshold of the electronic device is set to the second charging current threshold, the maximum charging current value of the electronic device is not greater than the second charging current threshold. After the second charging current threshold is set successfully, second charging data of the electronic device under the second charging current threshold is collected. The second charging data may include the second charging voltage value and the second charging current value. The second charging voltage value refers to a voltage provided by the USB host device for the electronic device under the second charging current threshold, and the second charging current value refers to a current provided by the USB host device for the electronic device under the second charging current threshold. In specific implementation, the power management integrated circuit of the electronic device has a corresponding ADC configured to monitor values such as the charging current and the charging voltage. Therefore, the second charging voltage value and the second charging current value can be obtained by reading corresponding values in the ADC. The data collection point may be set on the PMIC, corresponding to the power input point of the electronic device. In a specific implementation, to obtain collected data that is more accurate, collection may be performed multiple times (for example, five times), and an average value of collected data is used as final measurement data to calculate the maximum charging current value.

S102: The fast charging apparatus determines, according to the charging data set, a maximum charging current value corresponding to the electronic device.

In a specific implementation, the fast charging apparatus obtains, by means of calculation according to the first charging voltage value, the first charging current value, the second charging voltage value, and the second charging current value, a maximum charging current value corresponding to the electronic device.

In a specific implementation, step S102 may include:

S102A: The fast charging apparatus obtains a supply voltage value of the USB host device and an impedance value of a USB connection cable by means of calculation according to the first charging voltage value, the first charging current value, the second charging voltage value, and the second charging current value.

S102B: The fast charging apparatus obtains a supply current consumption rate coefficient by means of calculation according to the supply voltage value of the USB host device, the impedance value of the USB connection cable, the first charging current threshold, and the second charging current threshold.

S102: The fast charging apparatus determines, according the supply current consumption rate coefficient obtained by means of calculation, a maximum charging current value that corresponds to the electronic device when a minimum working voltage of the electronic device is met.

S103: The fast charging apparatus sets the determined maximum charging current value as a third charging current threshold of the electronic device, and controls charging of the electronic device according to the third charging current threshold.

In this case, the fast charging apparatus sets the determined maximum charging current value as a third charging current threshold of the electronic device, and controls charging of the electronic device according to the third charging current threshold. That is, the fast charging apparatus controls the charging current of the electronic device within the third charging current threshold by means of processing, that is, a maximum charging current of the electronic device is less than or equal to the third charging current threshold. In this embodiment of the present disclosure, the third charging current threshold is greater than the first charging current threshold, and the first charging current threshold is greater than the second charging current threshold.

In a specific implementation, the fast charging apparatus sets a register of the power management integrated circuit PMIC of the electronic device, and stores, in the register, the charging current threshold that is set for the electronic device, for example, the third charging current threshold. After the PMIC detects that there is a device coupled to a charging system, that is, after the PMIC determines that the electronic device is connected to the USB host device using the USB interface, a charging current and a charging voltage of the electronic device are adjusted according to the third charging current threshold stored in the register. In an embodiment, the PMIC includes a pulse signal generator, a voltage regulator circuit, a pulse width adjustment circuit, a voltage and current detection circuit, and a feedback circuit. The PMIC controls the intensity of the charging current using the voltage and current detection circuit and the feedback circuit such that the charging current is not greater than the third charging current threshold set in the register, thereby implementing control over charging of the electronic device according to the third charging current threshold. It should be noted that, the above descriptions are merely exemplary descriptions of this embodiment, and an order of steps is not limited in the present disclosure.

In this embodiment of the present disclosure, when an electronic device has a successful communication handshake with a USB host device using a USB interface, by presetting a first charging current threshold and a second charging current threshold for the electronic device, a first charging voltage value and a first charging current value of the electronic device under the first charging current threshold, and a second charging voltage value and a second charging current value of the electronic device under the second charging current threshold are separately obtained by means of measurement; a maximum charging current value corresponding to the electronic device is determined according to charging data obtained by means of measurement; the determined maximum charging current value is set as a third charging current threshold of the electronic device; and charging of the electronic device is controlled according to the third charging current threshold. Because the maximum charging current value obtained by means of measurement in the present disclosure is accurate and reliable, and is generally greater than 500 mA, while ensuring that the device is safe, a charging speed of the electronic device is greatly improved, the charging efficiency of the device is improved, and fast charging of the device is implemented.

Another Embodiment

Figure 2:
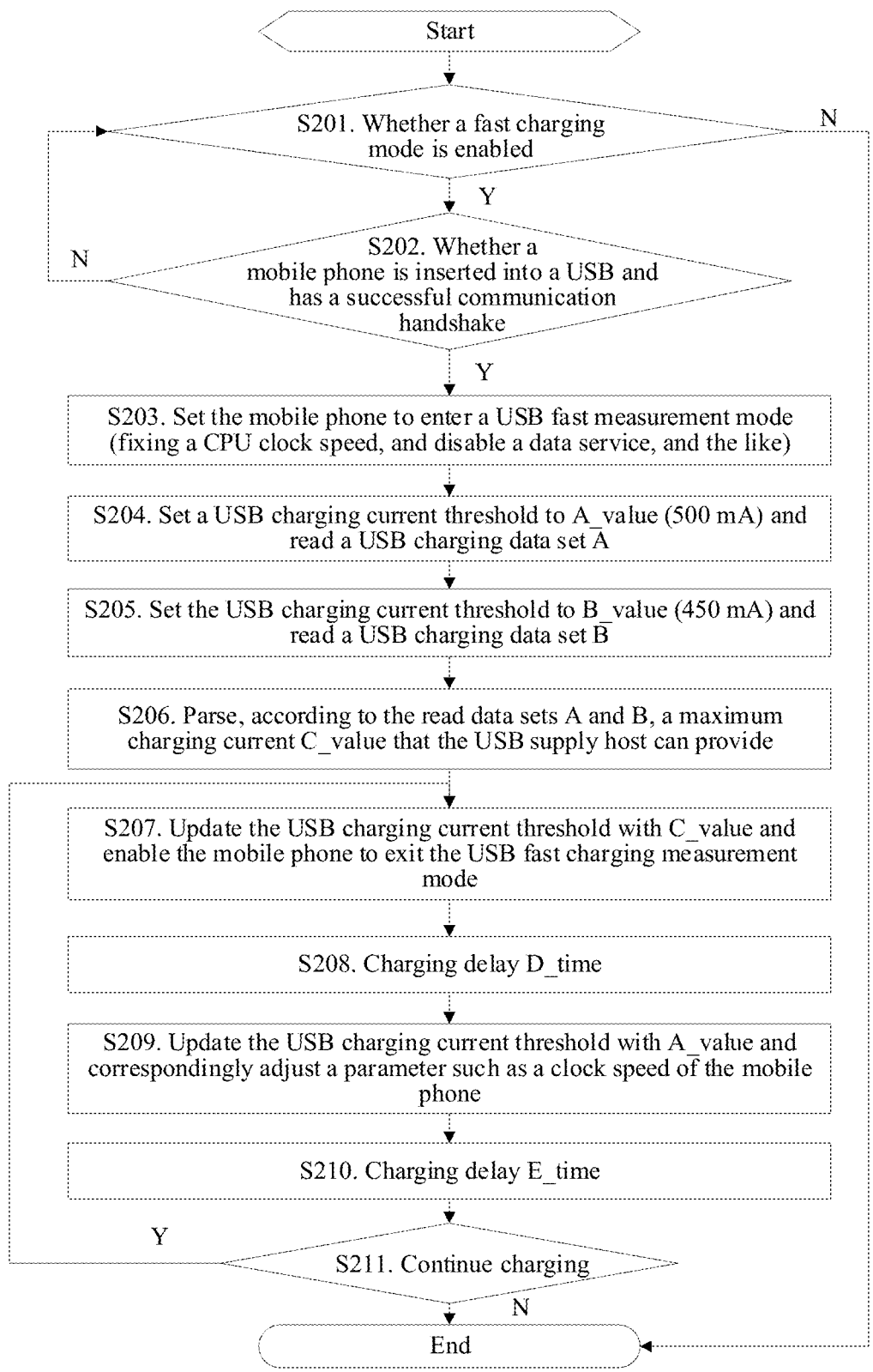
FIG. 2 is a schematic diagram of another embodiment of a fast charging method for an electronic device according to the present disclosure.

Refer to FIG. 2, which is a schematic diagram of another embodiment of a fast charging method for an electronic device according to the present disclosure.

In this embodiment of the present disclosure, to ensure more sufficient heat dissipation of a USB power cable, after an electronic device is charged for a period of time using a determined maximum charging current value, a charging current of the electronic device may be switched between the maximum charging current value and a first charging current threshold to charge the electronic device, to further ensure that USB charging is fast, safe, and reliable. The following describes a specific implementation method of the present disclosure using an example in which the electronic device is a mobile phone and a USB host device is a PC. A person skilled in the art can understand that the following method may be applied to another electronic device having a USB interface. The USB host device is not limited to the PC either, and may further be another device having a USB interface.

S201: A fast charging apparatus determines whether a mobile phone enables a USB fast charging mode; and if yes, go to step S202; or if not, the procedure ends.

S202: The fast charging apparatus determines whether the mobile phone is inserted into a USB host device and has a successful communication handshake with the USB host device. If yes, go to step S203; if not, perform polling and wait until a data connection between a USB of the mobile phone and a USB device of a PC is established successfully.

S203: After the data connection between the USB of the mobile phone and the PC USB is established successfully, the fast charging apparatus sets the mobile phone to be in a USB fast charging measurement mode. In this case, to more accurately obtain charging data about charging the mobile phone using the USB, a CPU clock speed and backlight luminance may be fixed, and functions such as a data service may be disabled.

S204: The fast charging apparatus sets a USB charging current threshold to a first charging current threshold A_value (500 mA) and collects a first charging data set A of the mobile phone under this threshold.

In a specific implementation, the first charging data set A may include a USB first charging voltage $V_A$, a first charging current $I_A$, a current that is supplied from the USB and that is consumed by the mobile phone, a current for charging a battery, and the like.

S205: The fast charging apparatus sets the USB charging current threshold to a second charging current threshold B_value (450 mA) and collects a charging data set B of the mobile phone under this threshold.

In a specific implementation, the charging data set B may include a USB charging voltage $V_B$, a charging current $I_B$, a current that is supplied from the USB and that is consumed by the mobile phone, a current for charging a battery, and the like.

S206: The fast charging apparatus performs analysis and obtains, by means of calculation according to the charging data set A and the charging data set B that are obtained by means of measurement, a maximum supply current value C_value that a current USB power supply device can provide.

Figure 3:
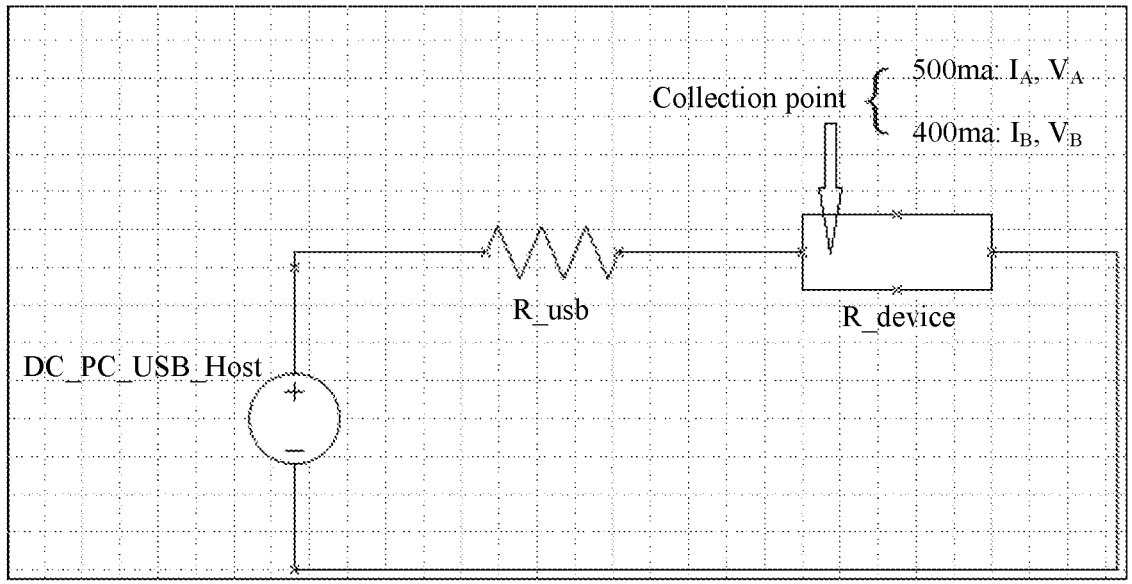
FIG. 3 is a schematic diagram of an equivalent circuit of a fast charging method for an electronic device according to the present disclosure.

The following provides a detailed description. Refer to FIG. 3, which is a schematic diagram of an equivalent circuit of a fast charging method for an electronic device according to the present disclosure. In FIG. 3, R_device is equivalent to the electronic device (for example, a mobile phone) having a USB interface, and DC_PC_USB_Host is equivalent to a USB Host power supply of the USB host device (for example, a PC), and is equivalent to a power source. R_usb is equivalent to a USB connection cable (USB Cable). A charging data collection point is set on a PMIC inside the electronic device (for example, a mobile phone), that is, on a power input point of the electronic device.

It is assumed that when a first charging current threshold A_value is set to 500 mA, a first charging current and a first charging voltage collected at the collection point are $I_A$ and $V_A$; and when a second charging current threshold B_value is set to 450 mA, a second charging current and a second charging voltage collected at the collection point are $I_B$ and $V_B$.

A supply voltage value $V_{ba}$ of the USB host device and an impedance value $R_{usb}$ of the USB connection cable are first obtained by means of calculation according to the first charging voltage value $V_A$, the first charging current value $I_A$, the second charging voltage value $V_B$, and the second charging current value $I_B$ that are obtained by means of measurement.

Therefore, the impedance value $R_{usb}$ of the USB connection cable and the supply voltage value $V_{bat}$ of the USB host device can be obtained by means of calculation according to formulas (1) and (2), as follows:

when the first charging current threshold A_value is set to 500 mA, $$V_{bat}=I_A*R_{usb}+V_A \tag{1}$$

when the second charging current threshold A_value is set to 450 mA, $$V_{bat}=I_B*R_{usb}+V_B \tag{2}$$

$R_{usb}$ and $V_{bat}$ can be obtained by means of calculation by substituting the collected $I_A$ and $V_A$ into (1) and substituting the collected $I_B$ and $V_B$ into (2).

Therefore, the supply voltage value $V_{bat}$ of the USB host device and the impedance value $R_{usb}$ of the USB connection cable can be obtain by means of calculation.

Then, a charging current consumption rate coefficient is obtained by means of calculation using the supply voltage value of the USB host device and the impedance value of the USB connection cable that are obtained by means of calculation, the first charging current threshold, and the second charging current threshold.

In specific implementation, charging current consumption rate coefficients k and b can be obtained by means of calculation using formulas (4) and (5).

$$500 = k*I_A + b \quad (3)$$

$$450 = k*I_B + b \quad (4)$$

A slope k and an intercept b, that is, the charging current consumption rate coefficients, can be obtained by means of calculation by substituting the collected first charging current value $I_A$ and second charging current value $I_B$ into formulas (4) and (5).

Finally, a maximum charging current value that corresponds to the electronic device when a minimum working voltage of the electronic device is met is obtained according to the charging current consumption rate coefficients obtained by means of calculation. When a lower limit required by a USB protocol is met, that is, when a minimum working voltage 4.75 V of the collection point is met, a current value of a collection current is $I_C$. Therefore:

$$V_{bat} = I_C * R_{usb} + 4.75V \quad (5)$$

The collection current $I_C$ can be obtained by means of calculation according to formula (5).

Because there is a loss during transmission of the current, the maximum charging current value C_value and $I_c$ meet the following condition:

$$C\_value = k*I_C + b \quad (6)$$

Therefore, a value of the maximum charging current C_value can be obtained by substituting the obtained charging current consumption rate coefficients k and b into formula (6).

S207: The fast charging apparatus sets a charging current threshold of the mobile phone to a maximum charging current value C_value and enables the mobile phone to exit the USB fast charging measurement mode, to restore previous parameters of the mobile phone such as a clock speed and backlight and resume functions such as a data service.

S208: The fast charging apparatus controls, using the determined maximum charging current value C_value as a third charging current threshold, the electronic device to be charged for a time of a first time value D_time under the third charging current threshold.

S209: The fast charging apparatus switches the charging current threshold of the electronic device from the third charging current threshold to the first charging current threshold A_value, to charge the electronic device.

In a specific implementation, after the electronic device is charged for the first time value using the determined maximum charging current value C_value as the third charging current threshold, the charging current threshold of the electronic device is switched from the third charging current threshold C_value to the first charging current threshold A_value, to charge the electronic device.

In a specific implementation, there may be different implementation manners according to different triggering timing. In one possible implementation manner, a corresponding adjustment may be made according to temperature data detected by a temperature detection module of the electronic device. In an embodiment, temperature data of the electronic device is detected; it is determined whether the temperature data meets a first preset condition; and when the temperature data meets the first preset condition, a supply current of the electronic device is switched from the maximum charging current value to the first charging current threshold, to charge the electronic device. The first preset condition may be that the temperature data is greater than a first preset temperature threshold, or may be that the temperature data is within a preset temperature interval. In this case, if the electronic device gets hot, it is considered that the charging current threshold of the electronic device needs to be adjusted. In specific implementation, a dynamic adjustment may be made according to temperature changes. In an embodiment, a parameter such as a clock speed is properly adjusted according to a current clock speed used by the mobile phone or the like, and the USB charging current threshold is set to the first charging current threshold A_value.

In another possible implementation manner, when charging duration of the device is greater than or equal to a predetermined time threshold, switching is performed, which, for example, may include: determining whether duration in which charging of the electronic device is controlled according to the third charging current threshold is greater than a preset first time threshold; and when the duration in which charging of the electronic device is controlled according to the third charging current threshold is greater than the preset first time threshold, switching the charging current threshold of the electronic device from the third charging current value to the first charging current threshold, and controlling charging of the electronic device according to the first charging current threshold.

S210: The fast charging apparatus controls the electronic device to be charged for a time of a second time value E_time according to the first charging current threshold.

Determining of the time of the second time value E_time may be adjusted according to a temperature detected by a temperature detection module, or adjustment and switching may be performed according to whether charging duration of the device is greater than a preset threshold.

Similarly, in one possible implementation manner, the temperature data of the electronic device is detected; it is determined whether the temperature data meets a second preset condition; and when the temperature data meets the second preset condition, the charging current threshold of the electronic device is switched from the first charging current threshold to the maximum charging current value (the third charging current threshold), to charge the electronic device. The second preset condition may be that the temperature data is less than a second preset temperature threshold, or may be that the temperature data is within a preset temperature interval. In this case, the electronic device does not get hot or heat dissipation of the electronic device is relatively sufficient, and it is considered that the charging current threshold of the electronic device may be adjusted. In specific implementation, a dynamic adjustment may be made according to temperature changes. In an embodiment, parameters such as a clock speed are properly adjusted according to a current clock speed used by the mobile phone or the like, and a USB supply current is set to C_value.

In another possible implementation manner, when charging duration of the device is greater than or equal to a predetermined time threshold, switching is performed, which, for example, may include: determining whether duration in which charging of the electronic device is controlled according to the first charging current threshold is greater than a preset second time threshold; and when the duration in which charging of the electronic device is controlled according to the first charging current threshold is greater than the preset second time threshold, switching the charging current threshold of the electronic device from the first charging current value to the third charging current threshold, and controlling charging of the electronic device according to the third charging current threshold.

S211: The fast charging apparatus determines whether to continue charging; and if yes, go to step S207 to repeat the foregoing steps in cyclic manner until USB charging is finished or the USB is pulled out.

After charging using the first charging current threshold lasts a second time, it is determined whether to continue charging; and if yes, go to step S207, to switch the charging current threshold of the electronic device from the first charging current threshold to the maximum charging current value (that is, the third charging current threshold), to charge the electronic device; or if charging is already completed, the procedure ends.

It should be noted that, when a charging data set is obtained by means of measurement according to a preconfigured charging current threshold, detection may be performed multiple times, for example, detection is performed three times, which may be respectively detecting a first charging current value of an electronic device under a first charging current threshold, detecting a second charging current value of an electronic device under a second charging current threshold, and detecting a fourth charging current value of an electronic device under a fourth charging current threshold. A maximum charging current value is then determined according to charging data obtained by means of three times of detection. The case of performing detection multiple times may be implemented with reference to the methods shown in FIG. 1 to FIG. 3, and details are not described herein again. In this embodiment of the present disclosure, to implement fast charging of an electronic device, when the electronic device is in a fast charging mode and has a successful communication handshake with a USB host device using the USB interface, the electronic device is switched to a USB fast charging measurement mode. In this mode, by detecting multiple groups of USB safe charging currents, a maximum USB safe charging current that the USB host device (that is, a PC) can provide is obtained by means of analysis and calculation. In addition, a charging current threshold of the electronic device is switched between the maximum safe charging current C_value and a preset threshold A_value such that heat dissipation of a USB power cable can be more sufficient, which improves safety of charging.

It should be noted that, the fast charging method in the present disclosure is described above using an example in which the fast charging apparatus is an independent device. A person skilled in the art can understand that, the methods shown in FIG. 1 to FIG. 3 may be applied to an electronic device having a USB interface, that is, the methods may be performed by an electronic device having a USB interface.

Still Another Embodiment

Figure 4:
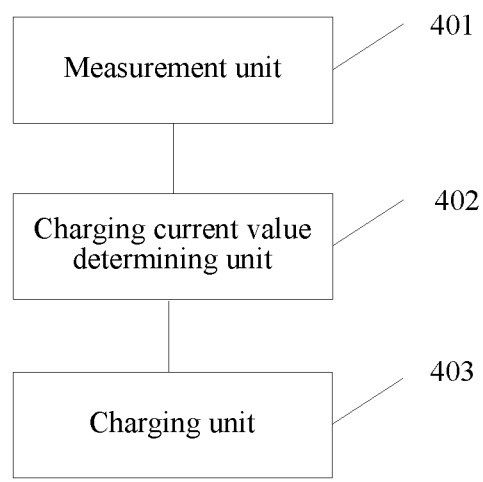
FIG. 4 is a schematic diagram of an embodiment of a fast charging apparatus according to the present disclosure.

Refer to FIG. 4, which is a schematic diagram of an embodiment of a fast charging apparatus according to the present disclosure. The fast charging apparatus shown in FIG. 4 is to implement the methods in the foregoing embodiments shown in FIG. 1 to FIG. 3.

A fast charging apparatus is applied to an electronic device, where the electronic device has a USB interface, and the apparatus includes: a measurement unit 401, configured to: when the electronic device has a successful communication handshake with a USB host device using the USB interface, obtain, by means of measurement according to a preset charging current threshold, a corresponding charging data set of the electronic device under the charging current threshold, where the charging current threshold includes at least a first charging current threshold and a second charging current threshold, and the charging data set includes at least a corresponding first charging voltage value and a corresponding first charging current value of the electronic device under the first charging current threshold, and a corresponding second charging voltage value and a corresponding second charging current value of the electronic device under the second charging current threshold; a charging current value determining unit 402, configured to determine, according to the charging data set, a maximum charging current value corresponding to the electronic device; and a charging unit 403, configured to set the determined maximum charging current value as a third charging current threshold of the electronic device, and control charging of the electronic device according to the third charging current threshold.

Further, the measurement unit is configured to: set a data collection point in a power management integrated circuit of the electronic device, and acquire the corresponding charging data set of the electronic device under the charging current threshold from an analog to digital converter of the power management integrated circuit.

Further, the charging current value determining unit includes: a first calculation unit, configured to obtain a supply voltage value of the USB host device and an impedance value of a USB connection cable by means of calculation according to the first charging voltage value, the first charging current value, the second charging voltage value, and the second charging current value that are obtained by the measurement unit by means of measurement; a second calculation unit, configured to obtain a charging current consumption rate coefficient by means of calculation according to the supply voltage value of the USB host device and the impedance value of the USB connection cable that are obtained by the first calculation unit by means of calculation, the first charging current threshold, and the second charging current threshold; and a third calculation unit, configured to determine, according to the charging current consumption rate coefficient obtained by the second calculation unit by means of calculation, a maximum charging current value that corresponds to the electronic device when a minimum working voltage of the electronic device is met.

Further, the apparatus further includes: a first switch unit, configured to: when the determined maximum charging current value is set as the third charging current threshold of the electronic device, switch the charging current threshold of the electronic device from the third charging current value to the first charging current threshold after charging of the electronic device is controlled according to the third charging current threshold for a first time value, and control charging of the electronic device according to the first charging current threshold; and a second switch unit, configured to: after charging of the electronic device is controlled according to the first charging current threshold for a second time value, switch the charging current threshold of the electronic device from the first charging current value to the third charging current threshold, and control charging of the electronic device according to the third charging current threshold.

Further, the first switch unit includes: a temperature detection unit, configured to detect temperature data of the electronic device; a first judging unit, configured to receive the temperature data detected by the temperature detection unit and determine whether the temperature data is greater than a first temperature threshold; and a first switch execution unit, configured to receive a determining result of the first judging unit and when the determining result shows that the temperature data is greater than the first temperature threshold, switch the charging current threshold of the electronic device from the third charging current value to the first charging current threshold, and control charging of the electronic device according to the first charging current threshold; or the first switch unit includes: a second judging unit, configured to determine whether duration in which charging of the electronic device is controlled according to the third charging current threshold is greater than a preset first time threshold; and a second switch execution unit, configured to receive a determining result of the second judging unit and when the determining result shows that the duration in which charging of the electronic device is controlled according to the third charging current threshold is greater than the preset first time threshold, switch the charging current threshold of the electronic device from the third charging current value to the first charging current threshold, and control charging of the electronic device according to the first charging current threshold.

Yet Another Embodiment

Figure 5:
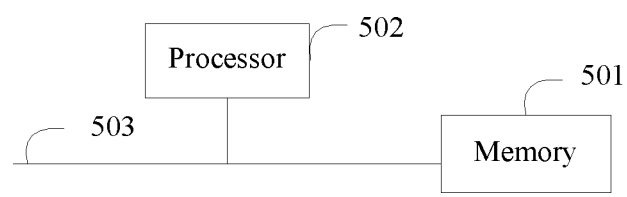
FIG. 5 is a schematic diagram of another embodiment of a fast charging apparatus according to the present disclosure.

Refer to FIG. 5, which is a schematic diagram of still another embodiment of a fast charging apparatus according to the present disclosure. The fast charging apparatus shown in FIG. 5 is to implement the methods in the foregoing embodiment shown in FIG. 1 to FIG. 3.

FIG. 5 shows a structure of a fast charging apparatus according to another embodiment of the present disclosure, which includes at least a memory 501 (for example, a CPU), a processor 502, and at least one communications bus 503, to implement connections and communication between these apparatuses. The processor 502 is configured to execute an executable module stored in the memory 501, for example, a computer program. The memory 501 may include a high-speed random access memory (RAM), and may further include a non-volatile memory, such as at least one magnetic disk memory.

In some implementation manners, the processor 502 is configured to: when the electronic device has a successful communication handshake with a USB host device using the USB interface, obtain, by means of measurement according to a preset charging current threshold, a corresponding charging data set of the electronic device under the charging current threshold, where the charging current threshold includes at least a first charging current threshold and a second charging current threshold, and the charging data set includes at least a corresponding first charging voltage value and a corresponding first charging current value of the electronic device under the first charging current threshold, and a corresponding second charging voltage value and a corresponding second charging current value of the electronic device under the second charging current threshold; determine, according to the charging data set, a maximum charging current value corresponding to the electronic device; and set the determined maximum charging current value as a third charging current threshold of the electronic device, and control charging of the electronic device according to the third charging current threshold.

In some implementation manners, the processor 502 is further configured to: set a data collection point in a power management integrated circuit of the electronic device, and acquire the corresponding charging data set of the electronic device under the charging current threshold from an analog to digital converter of the power management integrated circuit.

In some implementation manners, the processor 502 is further configured to: obtain a supply voltage value of the USB host device and an impedance value of a USB connection cable by means of calculation according to the first charging voltage value, the first charging current value, the second charging voltage value, and the second charging current value; obtain a charging current consumption rate coefficient by means of calculation according to the supply voltage value of the USB host device and the impedance value of the USB connection cable that are obtained by means of calculation, the first charging current threshold, and the second charging current threshold; and determine, according to the charging current consumption rate coefficient obtained by means of calculation, a maximum charging current value that corresponds to the electronic device when a minimum working voltage of the electronic device is met.

In some implementation manners, the processor 502 is further configured to: when the determined maximum charging current value is set as the third charging current threshold of the electronic device, switch the charging current threshold of the electronic device from the third charging current value to the first charging current threshold after charging of the electronic device is controlled according to the third charging current threshold for a first time value, and control charging of the electronic device according to the first charging current threshold.

In some implementation manners, the processor 502 is further configured to: after charging of the electronic device is controlled according to the first charging current threshold for a second time value, switch the charging current threshold of the electronic device from the first charging current value to the third charging current threshold, and control charging of the electronic device according to the third charging current threshold.

In some implementation manners, the processor 502 is further configured to: detect temperature data of the electronic device; determine whether the temperature data is greater than a first temperature threshold; and when the temperature data is greater than the first temperature threshold, switch the charging current threshold of the electronic device from the third charging current value to the first charging current threshold, and control charging of the electronic device according to the first charging current threshold.

In some implementation manners, the processor 502 is further configured to: determine whether duration in which charging of the electronic device is controlled according to the third charging current threshold is greater than a preset first time threshold; and when the duration in which charging of the electronic device is controlled according to the third charging current threshold is greater than the preset first time threshold, switch the charging current threshold of the electronic device from the third charging current value to the first charging current threshold, and control charging of the electronic device according to the first charging current threshold.

In some implementation manners, the third charging current threshold is greater than the first charging current threshold, and the first charging current threshold is greater than the second charging current threshold.

An Embodiment

Figure 6:
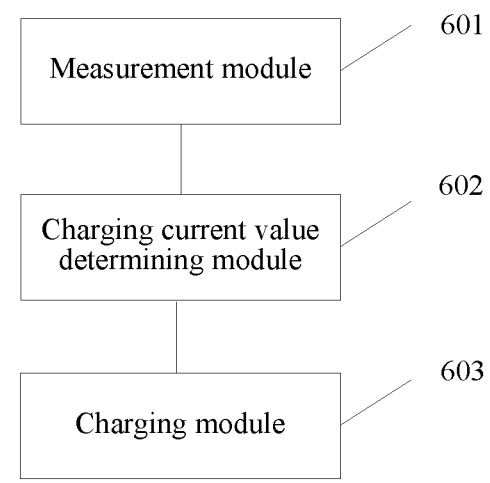
FIG. 6 is a schematic diagram of an embodiment of an electronic device according to the present disclosure.

Refer to FIG. 6, which is a schematic diagram of an embodiment of an electronic device according to the present disclosure. The fast charging apparatus shown in FIG. 6 is to implement the methods in the foregoing embodiments shown in FIG. 1 to FIG. 3.

An electronic device is provided, where the electronic device has a USB interface, and the device includes: a measurement module 601, configured to: when the electronic device has a successful communication handshake with a USB host device using the USB interface, obtain, by means of measurement according to a preset charging current threshold, a corresponding charging data set of the electronic device under the charging current threshold, where the charging current threshold includes at least a first charging current threshold and a second charging current threshold, and the charging data set includes at least a corresponding first charging voltage value and a corresponding first charging current value of the electronic device under the first charging current threshold, and a corresponding second charging voltage value and a corresponding second charging current value of the electronic device under the second charging current threshold; a charging current value determining module 602, configured to determine, according to the charging data set, a maximum charging current value corresponding to the electronic device; and a charging module 603, configured to set the determined maximum charging current value as a third charging current threshold of the electronic device, and control charging of the electronic device according to the third charging current threshold.

In some implementation manners, the measurement module is configured to: set a data collection point in a power management integrated circuit of the electronic device, and acquire the corresponding charging data set of the electronic device under the charging current threshold from an analog to digital converter of the power management integrated circuit.

In some implementation manners, the charging current value determining module includes: a first calculation module, configured to obtain a supply voltage value of the USB host device and an impedance value of a USB connection cable by means of calculation according to the first charging voltage value, the first charging current value, the second charging voltage value, and the second charging current value that are obtained by the measurement module by means of measurement; a second calculation module, configured to obtain a charging current consumption rate coefficient by means of calculation according to the supply voltage value of the USB host device and the impedance value of the USB connection cable that are obtained by the first calculation module by means of calculation, the first charging current threshold, and the second charging current threshold; and a third calculation module, configured to determine, according to the charging current consumption rate coefficient obtained by the second calculation module by means of calculation, a maximum charging current value that corresponds to the electronic device when a minimum working voltage of the electronic device is met.

In some implementation manners, the apparatus further includes: a first switch module, configured to: when the determined maximum charging current value is set as the third charging current threshold of the electronic device, switch the charging current threshold of the electronic device from the third charging current value to the first charging current threshold after charging of the electronic device is controlled according to the third charging current threshold for a first time value, and control charging of the electronic device according to the first charging current threshold; and a second switch module, configured to: after charging of the electronic device is controlled according to the first charging current threshold for a second time value, switch the charging current threshold of the electronic device from the first charging current value to the third charging current threshold, and control charging of the electronic device according to the third charging current threshold.

With reference to the third possible implementation manner of the second aspect, in a fourth possible implementation manner of the second aspect, the first switch module includes: a temperature detection module, configured to detect temperature data of the electronic device; a first judging module, configured to receive the temperature data detected by the temperature detection module and determine whether the temperature data is greater than a first temperature threshold; and a first switch execution module, configured to receive a determining result of the first judging module and when the determining result shows that the temperature data is greater than the first temperature threshold, switch the charging current threshold of the electronic device from the third charging current value to the first charging current threshold, and control charging of the electronic device according to the first charging current threshold; or the first switch module includes: a second judging module, configured to determine whether duration in which charging of the electronic device is controlled according to the third charging current threshold is greater than a preset first time threshold; and a second switch execution module, configured to receive a determining result of the second judging module and when the determining result shows that the duration in which charging of the electronic device is controlled according to the third charging current threshold is greater than the preset first time threshold, switch the charging current threshold of the electronic device from the third charging current value to the first charging current threshold, and control charging of the electronic device according to the first charging current threshold.

It should be noted that, steps of the foregoing embodiments of the present disclosure are not mandatory and are merely exemplary for description. Other embodiments may be obtained from the foregoing embodiments by means of modification, transformation, or combination and all fall within the protection scope of the present disclosure.

Those of ordinary skill in the art should understand that the procedure of the method according to the embodiments may be implemented by a program instructing relevant hardware. The program may be stored in a readable storage medium. When the program is run, the corresponding steps of the method according to the embodiments of the present disclosure are performed. The storage medium may be a read-only memory (ROM)/RAM, a magnetic disk, an optical disc, and the like.

The foregoing descriptions are merely exemplary implementation manners of the present disclosure. It should be noted that a person of ordinary skill in the art may make several improvements or polishing without departing from the principle of the present disclosure and the improvements or polishing shall fall within the protection scope of the present disclosure.

What is claimed is:
1. An apparatus, comprising:
a touch display screen;
a memory configured to store instructions; and
one or more processors coupled to the touch display screen and the memory, wherein the one or more processors are configured to execute the instructions stored in the memory to cause the apparatus to:
display a first graphical user interface (GUI) for selecting a charging mode, wherein the charging mode comprises a fast charging mode and a normal charging mode, and wherein the fast charging mode is associated with a first charging current value, the normal charging mode is associated with a second charging current value, and the first charging current value is greater than the second charging current value;
receive a first operation for selecting the fast charging mode;
be charged by another apparatus in the fast charging mode via the first charging current value in response to the first operation; and
switch the first charging current value to a third charging current value when a temperature data value of the apparatus is greater than a first temperature threshold, wherein the first charging current value is greater than the third charging current value and the third charging current value is non-zero.

2. The apparatus of claim 1, wherein the one or more processors are further configured to execute the instructions stored in the memory to cause the apparatus to:
receive a second operation for selecting the normal charging mode; and
be charged by the other apparatus in the normal charging mode via the second charging current value in response to the second operation.

3. The apparatus of claim 1, wherein the one or more processors are further configured to execute the instructions stored in the memory to cause the apparatus to adjust the first charging current value based on a light of the touch display screen.

4. The apparatus of claim 1, wherein the one or more processors are further configured to execute the instructions stored in the memory to cause the apparatus to switch the first charging current value to a third charging current value when a first time value of charging of the apparatus is greater than a preset first time threshold, wherein the first charging current value is greater than the third charging current value.

5. The apparatus of claim 4, wherein after the first charging current is switched to the third charging current value, the one or more processors are further configured to execute the instructions stored in the memory to cause the apparatus to switch the third charging current value to the first charging current value when a second time value of charging of the apparatus is greater than a preset second time threshold.

6. The apparatus of claim 4, wherein the first charging current value is greater than the third charging current value.

7. The apparatus of claim 1, wherein the one or more processors are further configured to execute the instructions stored in the memory to cause the apparatus to adjust the first charging current value while a data service of the apparatus is disabled.

8. A fast charging method implemented by a first electronic device, the fast charging method comprising:
displaying a first graphical user interface (GUI) for selecting a charging mode, wherein the charging mode comprises a fast charging mode and a normal charging mode, and wherein the fast charging mode is associated with a first charging current value, the normal charging mode is associated with a second charging current value, and the first charging current value is greater than the second charging current value;
receiving a first operation for selecting the fast charging mode;
charging the first electronic device in the fast charging mode in response to the first operation; and
switching the first charging current value to a third charging current value when a temperature data value of the electronic device is greater than a first temperature threshold, wherein the first charging current value is greater than the third charging current value and the third charging current value is non-zero.

9. The fast charging method of claim 8, further comprising:
receiving a second operation for selecting the normal charging mode; and
being charged by a second electronic device in the normal charging mode via the second charging current value in response to the second operation.

10. The fast charging method of claim 8, further comprising adjusting the first charging current value based on a light of a touch display screen of the first electronic device.

11. The fast charging method of claim 8, further comprising switching the first charging current value to a third charging current value when a first time value of charging of the first electronic device is greater than a preset first time threshold, wherein the first charging current value is greater than the third charging current value.

12. The fast charging method of claim 11, wherein after the first charging current is switched to the third charging current value, the method further comprises switching the third charging current value to the first charging current value when a second time value of charging of the first electronic device is greater than a preset second time threshold.

13. The fast charging method of claim 11, wherein the first charging current value is greater than the third charging current value.

14. The method of claim 8, further comprising adjusting the first charging current value while a data service of the first electronic device is disabled.

15. An apparatus, comprising:
a touch display screen;
a memory configured to store instructions; and
one or more processors coupled to the touch display screen and the memory, wherein the one or more processors are configured to execute the instructions stored in the memory to cause the apparatus to:
display a first graphical user interface (GUI) for selecting a charging mode, wherein the charging mode comprises a fast charging mode and a normal charging mode, and wherein the fast charging mode is associated with a first charging current value, the normal charging mode is associated with a second charging current value, and the first charging current value is greater than the second charging current value;
receive a first operation for selecting the fast charging mode;
be charged by another apparatus in the fast charging mode via the first charging current value in response to the first operation; and
adjust the first charging current value based on a light of the touch display screen.

16. The apparatus of claim 15, wherein the one or more processors are further configured to execute the instructions stored in the memory to cause the apparatus to adjust the first charging current value while a data service of the apparatus is disabled.

17. The apparatus of claim 15, wherein the one or more processors are further configured to execute the instructions stored in the memory to cause the apparatus to switch the first charging current value to a third charging current value when a temperature data value of the apparatus is greater than a first temperature threshold, wherein the first charging current value is greater than the third charging current value.

18. The apparatus of claim 15, wherein the one or more processors are further configured to execute the instructions stored in the memory to cause the apparatus to switch the first charging current value to a third charging current value when a first time value of charging of the apparatus is greater than a preset first time threshold, wherein the first charging current value is greater than the third charging current value.

19. The apparatus of claim 18, wherein after the first charging current value is switched to the third charging current value, the one or more processors are further configured to execute the instructions stored in the memory to cause the apparatus to switch the third charging current value to the first charging current value when a second time value of charging of the apparatus is greater than a preset second time threshold.

\* \* \* \* \*